(12) United States Patent
Tanaka

(10) Patent No.: US 10,361,557 B2
(45) Date of Patent: Jul. 23, 2019

(54) SEMICONDUCTOR DEVICE

(71) Applicant: Renesas Electronics Corporation, Tokyo (JP)

(72) Inventor: Masanori Tanaka, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 290 days.

(21) Appl. No.: 15/480,000

(22) Filed: Apr. 5, 2017

(65) Prior Publication Data

US 2017/0346281 A1    Nov. 30, 2017

(30) Foreign Application Priority Data

May 31, 2016  (JP) .................. 2016-108367

(51) Int. Cl.
  *H02H 9/00*   (2006.01)
  *H02H 9/04*   (2006.01)
  *H01L 27/02*  (2006.01)

(52) U.S. Cl.
  CPC ......... *H02H 9/046* (2013.01); *H01L 27/0251* (2013.01); *H01L 27/0255* (2013.01); *H01L 27/0285* (2013.01)

(58) Field of Classification Search
  CPC ... H02H 9/046; H01L 27/025; H01L 27/0255; H01L 27/0285
  See application file for complete search history.

(56) References Cited

U.S. PATENT DOCUMENTS

| | | | | |
|---|---|---|---|---|
| 4,736,271 A | * | 4/1988 | MacK | H01L 21/74 257/363 |
| 6,414,831 B1 | * | 7/2002 | Orchard-Webb | H01L 27/0255 257/355 |
| 2013/0003242 A1 | * | 1/2013 | Lin | H02H 9/046 361/111 |

FOREIGN PATENT DOCUMENTS

JP    2003-023084 A    1/2003

\* cited by examiner

*Primary Examiner* — Pete T Lee
(74) *Attorney, Agent, or Firm* — McGinn IP Law Group, PLLC.

(57) ABSTRACT

A semiconductor device that can hold ESD immunity with a simple configuration is provided.

The semiconductor device includes a power supply wiring, a ground wiring, an input circuit coupled between the power supply wiring and the ground wiring, an input pad which is coupled with the input circuit and to which a negative voltage lower than a voltage supplied to the ground wiring can be inputted, a plurality of first diodes provided between the ground wiring and the input pad, and a second diode provided between the input pad and the power supply wiring. A reverse bias breakdown voltage of the second diode is greater than a reverse bias breakdown voltage of each of the first diodes.

5 Claims, 4 Drawing Sheets

SEMICONDUCTOR DEVICE

CROSS-REFERENCE TO RELATED APPLICATIONS

The disclosure of Japanese Patent Application No. 2016-108367 filed on May 31, 2016 including the specification, drawings and abstract is incorporated herein by reference in its entirety.

BACKGROUND

The present disclosure relates to a semiconductor device, in particular to ESD (Electro Static Discharge) protection.

In a semiconductor device, an electrostatic protection element is provided to prevent internal circuits from being broken by static electricity. For example, an electrostatic protection element formed by a diode, a thyristor (SCR: Silicon Controlled Rectifier), or the like is coupled between a wiring to which a power supply potential is supplied (a power supply potential line) and a wiring to which a ground potential is supplied (a ground potential line). When static electricity is applied between the power supply potential line and the ground potential line, the static electricity is discharged through the electrostatic protection element and no excessive voltage is applied to the internal circuits, so that it is possible to prevent the internal circuits from being broken.

In this respect, Japanese Unexamined Patent Application Publication No. 2003-23084 discloses a configuration where a negative potential can be inputted.

SUMMARY

On the other hand, in the case of configuration whose voltage range is large so that a negative voltage is inputted, it is necessary to increase the number of stages of diodes on the ground potential line side and the power supply potential line side and the number of diodes increases, so that there is a problem that the layout region increases.

The present disclosure is made to solve the problem described above, and an object of the present disclosure is to provide a semiconductor device that can hold ESD immunity with a simple configuration.

Other objects and novel features will become apparent from the description of the present specification and the accompanying drawings.

According to an embodiment, a semiconductor device includes a power supply wiring, a ground wiring, an input circuit coupled between the power supply wiring and the ground wiring, an input pad which is coupled with the input circuit and to which a negative voltage lower than a voltage supplied to the ground wiring can be inputted, a plurality of first diodes provided between the ground wiring and the input pad, and a second diode provided between the input pad and the power supply wiring. A reverse bias breakdown voltage of the second diode is greater than a reverse bias breakdown voltage of each of the first diodes.

According to the embodiment, it is possible to hold ESD immunity with a simple configuration.

DETAILED DESCRIPTION

Figure 1:
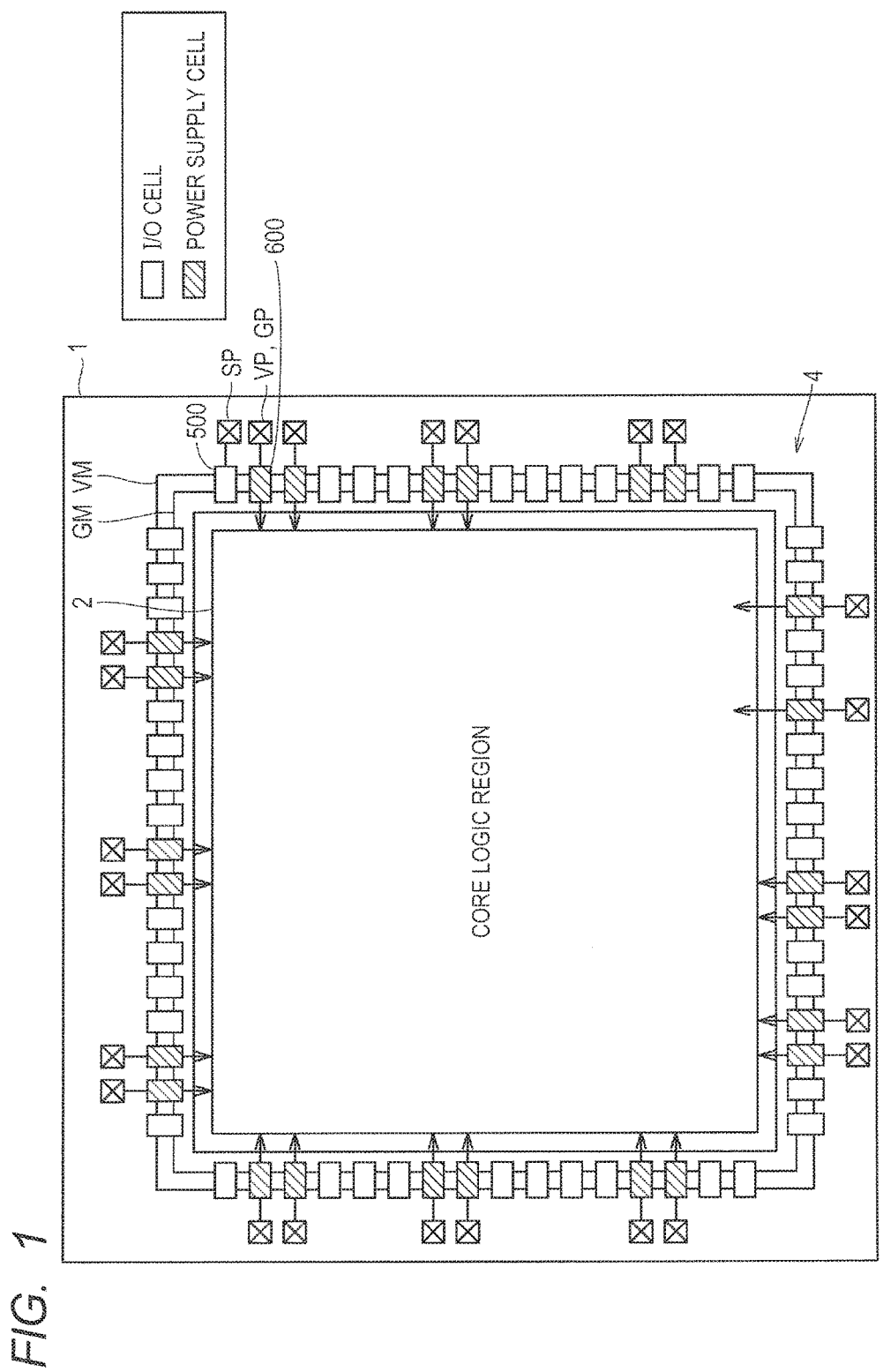
FIG. 1 is a diagram for explaining an entire semiconductor device 1 based on a first embodiment.

Embodiments will be described in detail with reference to the drawings. The same reference numerals are given to the same or corresponding portions in the drawings and the description thereof will not be repeated. In the embodiments, a semiconductor device represents any of a semiconductor wafer formed so that electronic circuits are integrated, each of semiconductor chips which are formed by dividing the semiconductor wafer into individual pieces, and a device where a single or a plurality of semiconductor chips are packaged by resin or the like.

First Embodiment

FIG. 1 is a diagram for explaining an entire semiconductor device 1 based on a first embodiment.

As shown in FIG. 1, the semiconductor device 1 includes a circumferential I/O region 4 provided in an outer circumferential region and a core logic region 2 that is arranged in an inner region and is formed as an ASIC (application specific integrated circuit) having a predetermined function.

The circumferential I/O region 4 is provided with an I/O cell 500 to be an input/output interface of a signal and a power supply cell 600 that receives an input of external power supply. Here, a case is shown where a power supply line VM and a ground line GM are arranged in the outer circumferential region. A pad VP and a pad GP are a power supply pad and a ground pad and coupled to the power supply cell 600. A pad SP is a signal pad and coupled to the I/O cell 500. The pads VP, GP, and SP are provided on a periphery of the semiconductor device 1 of FIG. 1.

Figure 2:
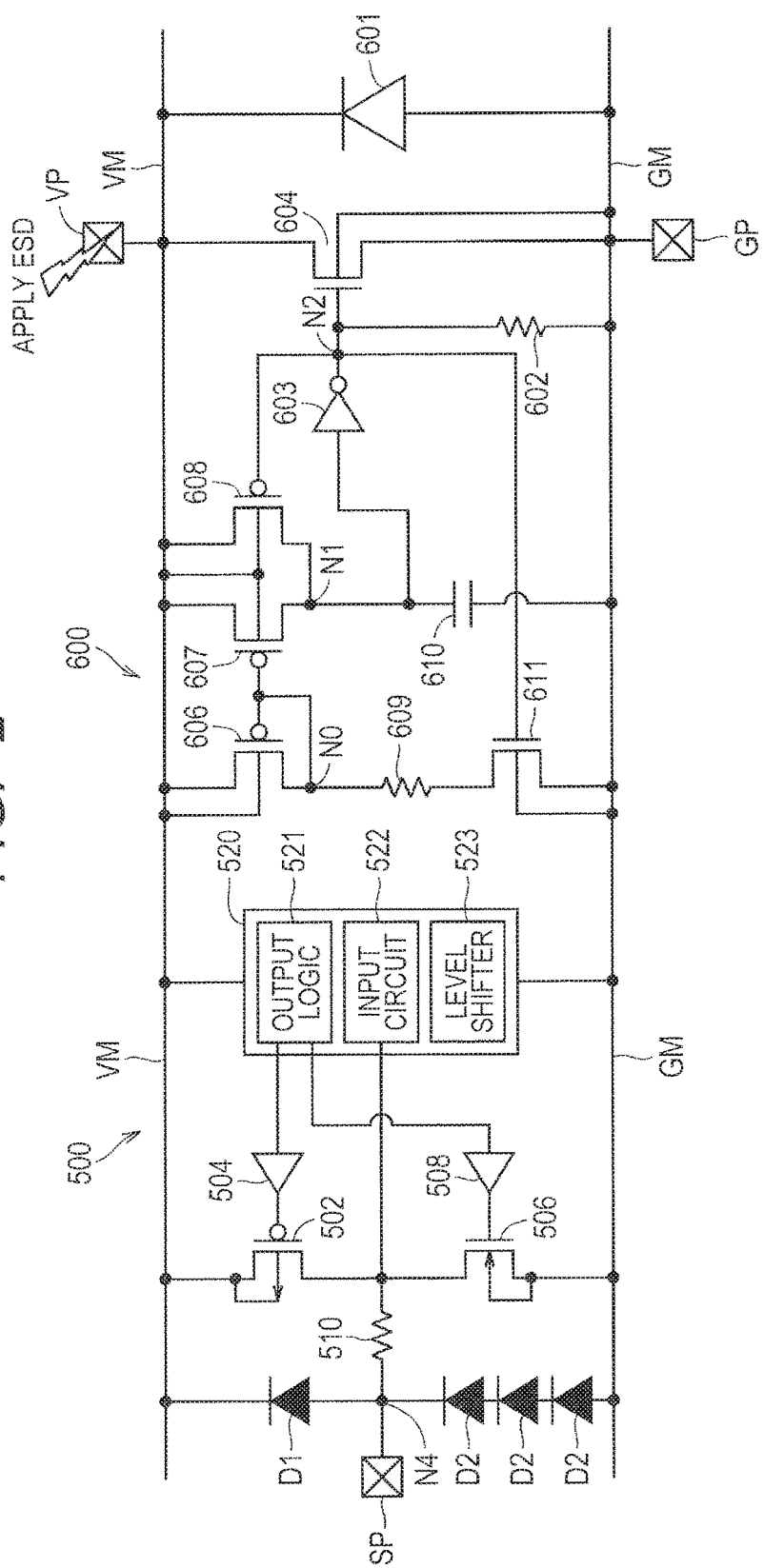
FIG. 2 is a diagram for explaining a circuit configuration of an I/O cell 500 and a power supply cell 600 based on the first embodiment.

FIG. 2 is a diagram for explaining a circuit configuration of the I/O cell 500 and the power supply cell 600 based on the first embodiment.

As illustrated in FIG. 2, the I/O cell 500 includes protection diodes D1 and D2, a P-channel MOS transistor 502, an N-channel MOS transistor 506, drivers 504 and 508, a resistor 510, and an input/output circuit 520.

The pad SP is coupled with a node N4. The protection diode D1 is provided between the node N4 and the power supply line VM. The anode of the protection diode D1 is coupled with the node N4 and the cathode of the protection diode D1 is coupled with the power supply line VM. Here, the pad SP is an input/output pad. The pad SP can receive an input signal and outputs an output signal.

A plurality of (three) stages of protection diodes D2 are provided between the node N4 and the ground line GM. The anode side of the protection diodes D2 is coupled with the ground line GM and the cathode side of the protection diodes D2 is coupled with the node N4. The resistor 510 is provided between the node N4 and an input circuit 522.

The P-channel MOS transistor 502 is provided in parallel with the protection diode D1 and serially coupled between the node N4 and the power supply line VM through the resistor 510. The P-channel MOS transistor 502 receives an input of a signal of the driver 504. The drivers 504 and 508 include an even number of inverters. Power is supplied to the drivers 504 and 508 from the power supply line VM and the ground line GM.

The N-channel MOS transistor 506 is provided in parallel with the protection diodes D2 and serially coupled between the node N4 and the ground line GM through the resistor 510. The N-channel MOS transistor 506 receives an input of a signal of the driver 508.

The input/output circuit 520 is provided between the power supply line VM and the ground line GM.

The input/output circuit 520 includes an output logic 521 that drives the drivers 504 and 508, the input circuit 522 that processes an input signal from the pad SP through the resister 510, and a level shifter 523 that increases or decreases voltage of a signal level.

Either one of the drivers 504 and 508 is driven according to a signal from the output logic 521. Then, the P-channel MOS transistor 502 or the N-channel MOS transistor 506 turns on and outputs a signal from the pad SP.

The power supply cell 600 includes an N-channel MOS transistor 604 that forms a power clamp circuit (protection circuit), an inverter 603, resistive elements 602 and 609, a capacitive element 610, P-channel MOS transistors 606, 607, and 608, and an N-channel MOS transistor 611. A diode 601 is a parasitic diode of the N-channel MOS transistor 604.

The anode of the diode 601 is coupled with the ground line GM and the cathode of the diode 601 is coupled with the power supply line VM.

The N-channel MOS transistor 604 is coupled between the power supply line VM and the ground line GM and the gate of the N-channel MOS transistor 604 is coupled with a node N2 of the inverter 603.

The P-channel MOS transistor 606 is serially coupled with the resistive element 609 and the N-channel MOS transistor 611 between the power supply line VM and the ground line GM.

The P-channel MOS transistor 606 is provided between the power supply line VM and a node NO and the gate of the P-channel MOS transistor 606 is coupled with the node NO. The resistive element 609 is serially coupled with the P-channel MOS transistor 606 and one end of the resistive element 609 is coupled with the node NO. The other end is coupled with the N-channel MOS transistor 611. The N-channel MOS transistor 611 is coupled between the resistive element 609 and the ground line GM and the gate of the N-channel MOS transistor 611 is coupled with the node N2.

The P-channel MOS transistor 607 is provided between the power supply line VM and a node N1 so as to form a current mirror circuit with the P-channel MOS transistor 606. The gate of the P-channel MOS transistor 607 is coupled with the node NO. The capacitive element 610 is serially coupled with the P-channel MOS transistor 607 through the node N1 between the power supply line VM and the ground line GM.

The inverter 603 receives an input from the node N1 and outputs an inversion signal of the node N1 to the node N2. Although the power supply of the inverter 603 is not shown, the power of the inverter 603 is supplied from the power supply line VM and the ground line GM, and the same goes for the other embodiment.

The resistive element 602 is coupled between the node N2 and the ground line GM. An output of the inverter 603 is pulled down to the ground line GM through the resistive element 602, so that it is possible to suppress variation of a gate input of the N-channel MOS transistor 604 when the output of the inverter 603 varies in an undesired manner.

The N-channel MOS transistor 611 functions as an element that activates a current mirror circuit formed by the P-channel MOS transistors 606 and 607 and the resistive element 609. When the N-channel MOS transistor 611 is turned on, the current mirror circuit is activated. On the other hand, when the N-channel MOS transistor 611 is turned off, the current mirror circuit is deactivated. Here, the activation of the current mirror circuit is to cause the current mirror circuit to operate by causing a current to flow through the transistors included in the current mirror circuit, and the same goes for the other embodiment.

The P-channel MOS transistor 608 is coupled between the power supply line VM and the node N1 in parallel with the P-channel MOS transistor 607 and the gate of the P-channel MOS transistor 608 is coupled with the node N2. The P-channel MOS transistor 608 operates complementarily with the N-channel MOS transistor 611. In other words, when the N-channel MOS transistor 611 is ON, the P-channel MOS transistor 608 is OFF. On the other hand, in a steady state in which the N-channel MOS transistor 611 is OFF, the P-channel MOS transistor 608 is ON and couples the power supply line VM with the node N1, so that it is possible to suppress undesired variation of the node N1.

Here, the configuration of the power clamp circuit is described as an example of the power supply cell 600. However, it is not particularly limited to this, and another circuit may be formed.

Here, a case will be described in which ESD current is flown (applied) to the pad VP.

In the steady state, the node N2 of the inverter 603 is set to "L" level. Therefore, the N-channel MOS transistor 604 is OFF. The P-channel MOS transistor 608 is ON. The node N2 is "L" level, so that the N-channel MOS transistor 611 is ON and the current mirror circuit is deactivated.

On the other hand, when a high voltage due to ESD current is applied to the pad VP, the level of the power supply line VM directly changes following that. Accordingly, a potential difference (Vgs) temporarily occurs between the gate and the source of a P-channel MOS transistor included in the inverter 603 and the P-channel MOS transistor turns on. Thereby, the level of the node N2 temporarily changes from "L" level to "H" level.

When a gate potential of the node N2 changes, the N-channel MOS transistor 604 is turned on and a high voltage of the power supply line VM is released to the ground line GM.

Further, when the level of the node N2 changes to "H" level, the P-channel MOS transistor 608 turns off. Further, the N-channel MOS transistor 611 turns on and the current mirror circuit operates.

When the current mirror circuit is activated, a current flows into the capacitive element 610 coupled with the node N1 from the power supply line VM through the P-channel MOS transistor 607. At that time, a level variation of the node N1 rises while being delayed according to a time constant. When the potential of the node N1 exceeds a threshold value of the inverter 603, an N-channel MOS transistor of the inverter 603 turns on. Thereby, the level of the node N2 transitions to "L" level again.

When the gate potential of the node N2 changes, the N-channel MOS transistor 604 is turned off and current outflow from the power supply line VM to the ground line GM is stopped. Further, the N-channel MOS transistor 611 is turned off and the current mirror circuit is deactivated.

Furthermore, the P-channel MOS transistor 608 turns on, and the node N1 and the power supply line VM are electrically coupled. Thereby, the steady state is restored.

Here, a case will be considered where a voltage level inputted into the pad SP is lower than a voltage level of the ground line GM.

Figure 3:
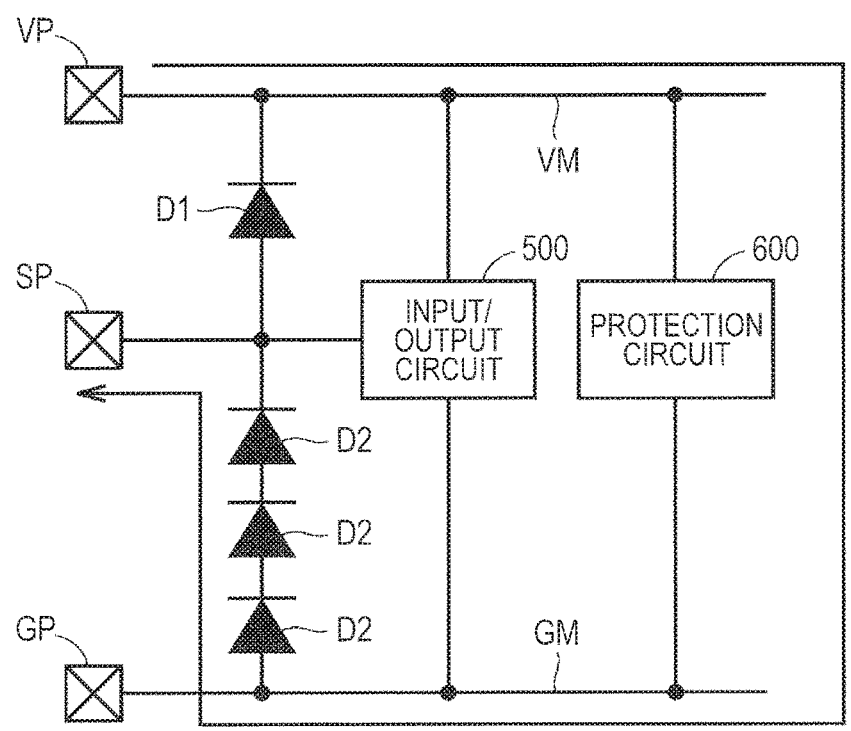
FIG. 3 is a diagram for explaining a path of current flowing through a pad SP.

FIG. 3 is a diagram for explaining a path of current flowing through the pad SP.

As shown in FIG. 3, when the voltage level inputted into the pad SP is lower than the voltage level of the ground line GM, the ESD current flows into the pad SP through the diode D2.

Therefore, in the present configuration, a plurality of diodes D2 are provided to suppress the current inputted into the pad SP.

However, in the present configuration where the ESD current flows, a high reverse bias voltage may be applied to the protection diode D1 provided between the node N4 and the power supply line VM.

Therefore, when a plurality of stages of protection diodes D1 are provided on the power supply line side, the number of circuit elements increases, resulting in an increase of circuit area.

Therefore, the configuration according to the first embodiment changes diode characteristics of the protection diode D1 and the protection diode D2.

Figure 4:
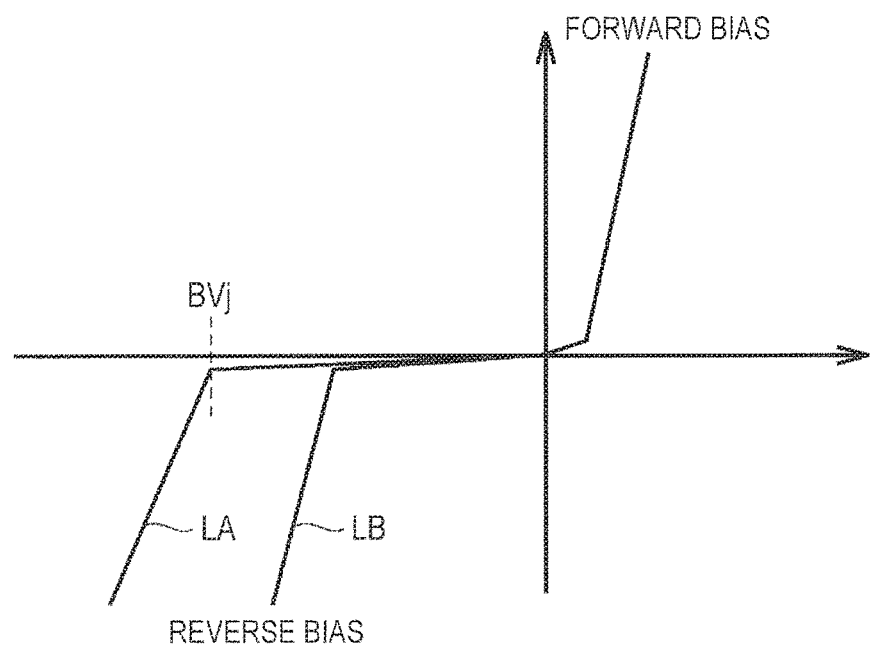
FIG. 4 is a diagram for explaining diode characteristics of protection diodes D1 and D2.

FIG. 4 is a diagram for explaining the diode characteristics of the protection diodes D1 and D2.

As shown in FIG. 4, a characteristic line LA of the protection diode D1 and a characteristic line LB of the protection diode D2 are shown.

Reverse bias breakdown voltages (junction withstand voltages) of the characteristic line LA of the protection diode D1 and the characteristic line LB of the protection diode D2 are different from each other.

Specifically, a case is shown where the reverse bias breakdown voltage (junction withstand voltage) of the characteristic line LA of the protection diode D1 is higher than that of the characteristic line LB of the protection diode D2.

The protection diode D1 having the characteristic line LA is provided, so that it is possible to protect the protection diode D1 without increasing the number of the protection diodes D1.

Accordingly, it is possible to realize a semiconductor device that can hold EDS immunity with a simple configuration without increasing the number and area of the protection diodes D1.

Figure 5:
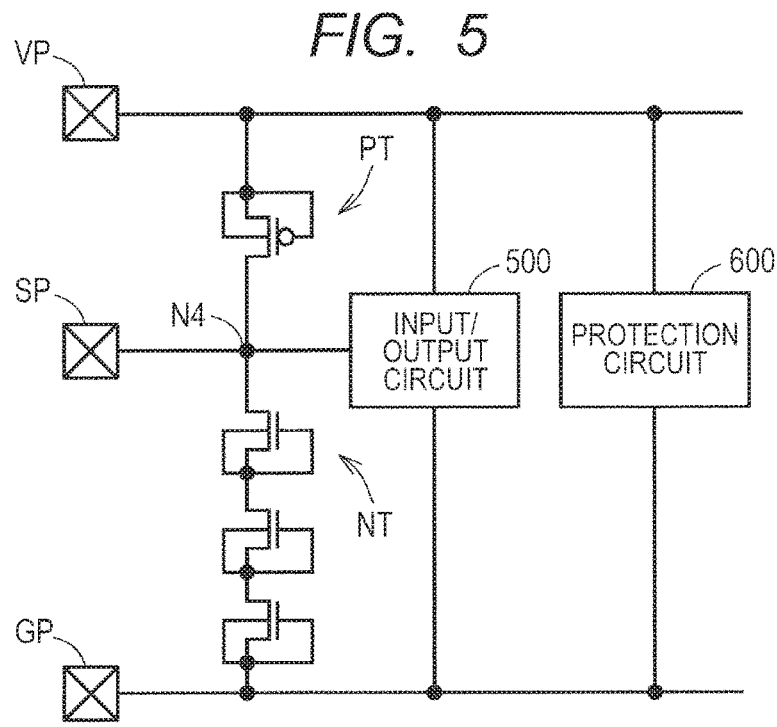
FIG. 5 is a circuit configuration diagram of the protection diodes D1 and D2.

FIG. 5 is a circuit configuration diagram of the protection diodes D1 and D2.

As shown in FIG. 5, it is possible to form the protection diodes D1 and D2 as MOS transistors. By forming the protection diodes D1 and D2 as MOS transistors, it is possible to reduce the area of the protection diodes D1 and D2 by using a simple configuration.

Specifically, the protection diode D1 is formed by a P-channel MOS transistor PT where the source is coupled with the gate. The protection diode D2 is formed by an N-channel MOS transistor NT where the source is coupled with the gate. By the above configuration, it is possible to maintain high ESD immunity by a snapback operation of the MOS transistors.

Further, as a method for raising the reverse bias breakdown voltage of the protection diode D1, a well density of the transistor is adjusted.

Specifically, when performing process tuning, the well density of the protection diode D1 may be set lower than that of the protection diode D2.

Second Embodiment

In the first embodiment described above, a configuration is described where ESD immunity is maintained when the voltage level inputted into the pad SP is lower than the voltage level of the ground line GM.

On the other hand, a case is considered where the voltage level inputted into the pad SP is higher than the voltage level of the power supply line VM.

Figure 6:
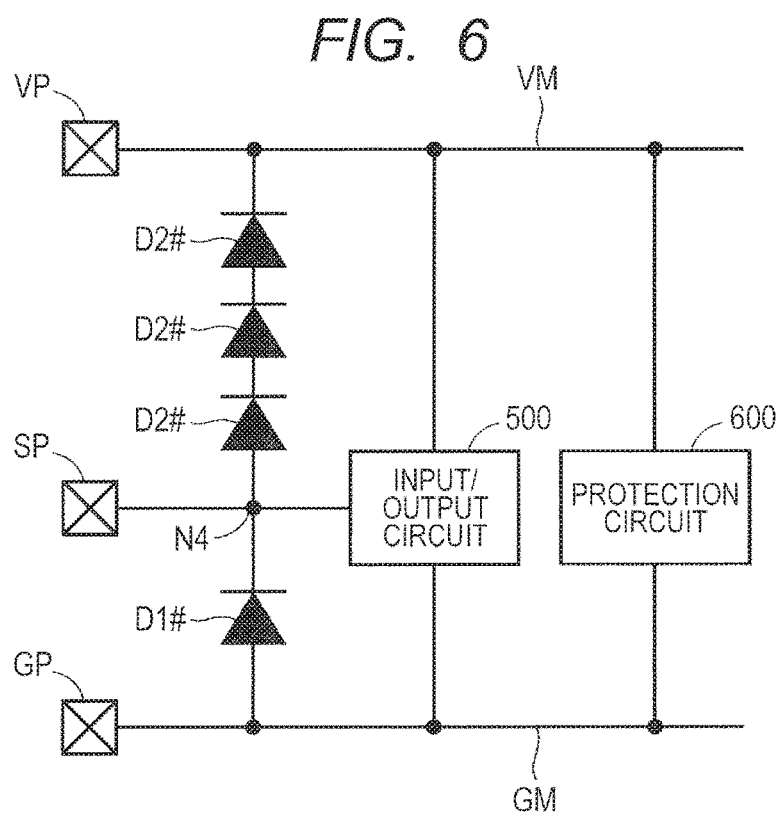
FIG. 6 is a diagram for explaining a configuration of a protection diode based on a second embodiment.

FIG. 6 is a diagram for explaining a configuration of a protection diode based on a second embodiment.

Referring to FIG. 6, when the voltage level inputted into the pad SP is higher than the voltage level of the power supply line VM, the protection diode D1 is replaced with a protection diode D1# and the protection diode D1# is provided between the node N4 and the ground line GM. Further, the protection diode D2 is replaced with a protection diode D2# and a plurality of (three) stages of protection diodes D2# are provided between the node N4 and the power supply line VM. The above points are different from the first embodiment. The other components are the same as those in the first embodiment, so that the description thereof will not be repeated.

In the case of the present configuration, when the voltage level inputted into the pad SP is higher than the voltage level of the power supply line VM, the ESD current flows into the power supply line VM through the diodes D2#.

Therefore, in the present configuration, a plurality of diodes D2# are provided to suppress current flowing into the power supply line VM. A high reverse bias voltage may be applied to the protection diode D1# provided between the node N4 and the ground line VM.

Therefore, when a plurality of stages of protection diodes D1# are provided on the ground line side, the number of circuit elements increases, resulting in an increase of circuit area.

Therefore, the configuration according to the second embodiment changes diode characteristics of the protection diode D1# and the protection diode D2#.

Specifically, as described in the first embodiment, the reverse bias breakdown voltage (junction withstand voltage) of the protection diode D1# is set higher than that of the protection diode D2#. By providing the protection diode D1#, it is possible to protect the protection diode D1# without increasing the number of the protection diodes D1#.

Accordingly, it is possible to realize a semiconductor device that can hold EDS immunity with a simple configuration without increasing the number and area of the protection diodes D1#.

While the present disclosure has been specifically described based on the embodiments, it is needless to say that the present disclosure is not limited to the embodiments and may be variously modified without departing from the scope of the invention.

What is claimed is:

1. A semiconductor device comprising:
   a power supply wiring;
   a ground wiring;
   an input circuit coupled between the power supply wiring and the ground wiring;
   an input pad which is coupled with the input circuit and to which a negative voltage lower than a voltage supplied to the ground wiring can be inputted;
   a plurality of first diodes provided between the ground wiring and the input pad; and
   a second diode provided between the input pad and the power supply wiring, wherein a reverse bias breakdown voltage of the second diode is greater than a reverse bias breakdown voltage of each of the first diodes.

2. The semiconductor device according to claim 1, further comprising:
a protection circuit against electro static discharge, which is provided between the power supply wiring and the ground wiring.

3. The semiconductor device according to claim 1, wherein a well density of the first diodes is different from a well density of the second diode.

4. The semiconductor device according to claim 1, wherein the first diodes and the second diode are formed by MOS transistors, respectively.

5. A semiconductor device comprising:
a power supply wiring;
a ground wiring;
an input circuit coupled between the power supply wiring and the ground wiring;
an input pad which is coupled with the input circuit and to which a voltage higher than a voltage supplied to the power supply wiring can be inputted;
a plurality of first diodes provided between the power supply wiring and the input pad; and
a second diode provided between the input pad and the ground wiring,
wherein a reverse bias breakdown voltage of the second diode is greater than a reverse bias breakdown voltage of each of the first diodes.

* * * * *